US010256036B2

(12) United States Patent
Martinez et al.

(10) Patent No.: US 10,256,036 B2
(45) Date of Patent: Apr. 9, 2019

(54) MAGNETIC FIELD CONTAINMENT INDUCTORS

(71) Applicant: Apple Inc., Cupertino, CA (US)

(72) Inventors: Paul A. Martinez, Morgan Hill, CA (US); Ming Y. Tsai, San Jose, CA (US); Federico P. Centola, San Jose, CA (US); Martin Schauer, Fremont, CA (US); Cheung-Wei Lam, San Jose, CA (US); Jason C. Sauers, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 78 days.

(21) Appl. No.: 15/405,027

(22) Filed: Jan. 12, 2017

(65) Prior Publication Data

US 2018/0068784 A1    Mar. 8, 2018

Related U.S. Application Data

(60) Provisional application No. 62/385,164, filed on Sep. 8, 2016.

(51) Int. Cl.

| H01F 27/32 | (2006.01) |
|---|---|
| H01F 17/04 | (2006.01) |
| H01F 27/36 | (2006.01) |
| H05K 1/18 | (2006.01) |
| H05K 1/02 | (2006.01) |
| H01F 17/00 | (2006.01) |

(52) U.S. Cl.
CPC ....... *H01F 27/365* (2013.01); *H01F 17/0013* (2013.01); *H05K 1/023* (2013.01); *H05K 1/18* (2013.01); *H01F 2017/008* (2013.01)

(58) Field of Classification Search
CPC .... H01F 27/365; H01F 27/2805; H01F 27/36; H01F 2017/008; H01F 27/288
USPC ...................................... 336/221, 84 R, 84 M
See application file for complete search history.

(56) References Cited

U.S. PATENT DOCUMENTS

| 7,365,943 | B2* | 4/2008 | Yamakawa | ........... G11B 5/3116 |
|---|---|---|---|---|
| | | | | 360/125.33 |
| 7,650,931 | B2* | 1/2010 | Siu | ....................... F28D 15/0233 |
| | | | | 165/104.26 |
| 7,791,831 | B2* | 9/2010 | McGlennen | ......... G11B 7/0953 |
| | | | | 360/70 |
| 7,791,836 | B2* | 9/2010 | Masai | .................. G11B 5/3146 |
| | | | | 336/221 |
| 7,875,955 | B1 | 1/2011 | Hopper et al. | |

(Continued)

*Primary Examiner* — Alexander Talpalatski
*Assistant Examiner* — Joselito Baisa
(74) *Attorney, Agent, or Firm* — Fletcher Yoder PC

(57) ABSTRACT

A system includes a circuit board, an inductor including windings mounted on the circuit board, and a plurality of magnetic field containment devices. Each magnetic field containment device includes an independent electrical circuit that is not directly electrically connected via a conductor to any other magnetic field containment device. Each magnetic field containment device also includes a material of a certain relative permeability. Each magnetic field containment device at least partially surrounds the inductor and, in operation, at least partially contains a magnetic B-Field generated by electrical current in the windings of the inductor. The plurality of magnetic field containment devices, in operation, enables a certain saturation current in the inductor.

10 Claims, 13 Drawing Sheets

(56) References Cited

U.S. PATENT DOCUMENTS

| | | | |
|---|---|---|---|
| 2009/0091414 A1* | 4/2009 | Hopper | H01F 17/0013 |
| | | | 336/212 |
| 2014/0176292 A1* | 6/2014 | Ortiz | H01F 27/362 |
| | | | 336/84 C |
| 2014/0203398 A1 | 7/2014 | Sturcken | |
| 2014/0279548 A1 | 9/2014 | Wang et al. | |
| 2015/0340147 A1 | 11/2015 | Pennander | |
| 2015/0371756 A1 | 12/2015 | Sturcken et al. | |

\* cited by examiner

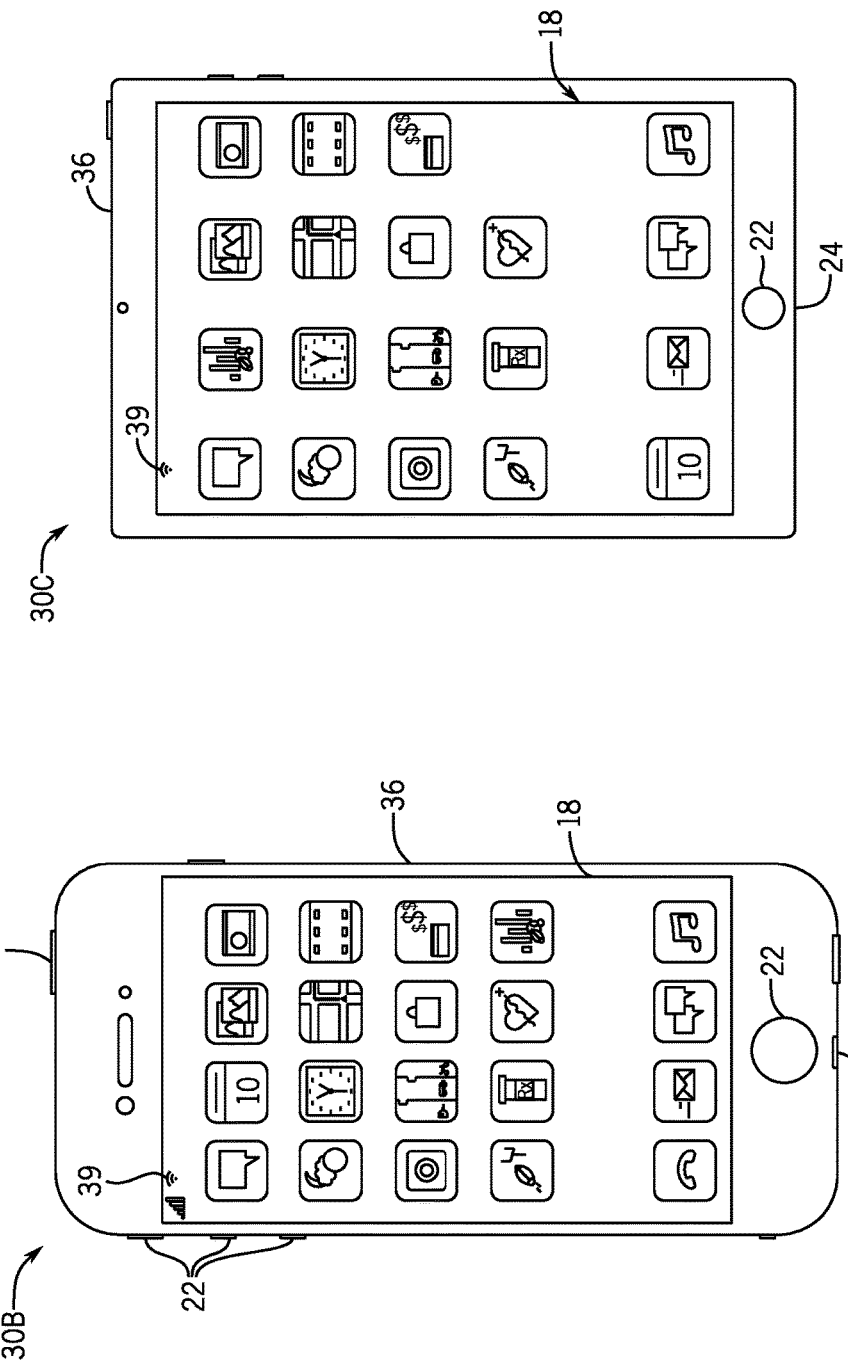

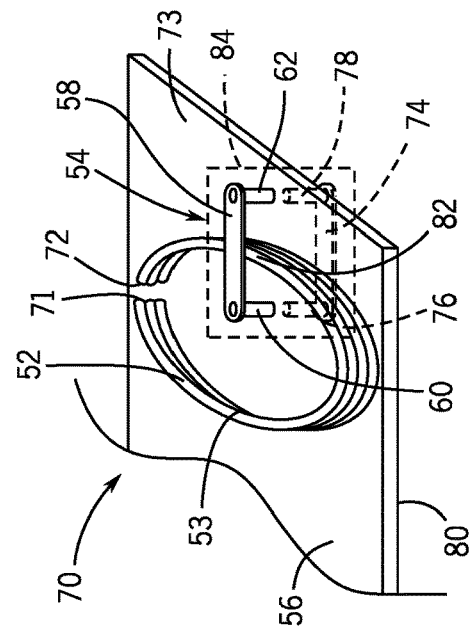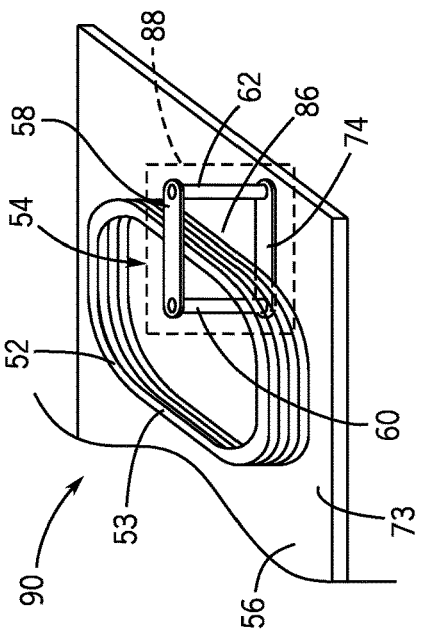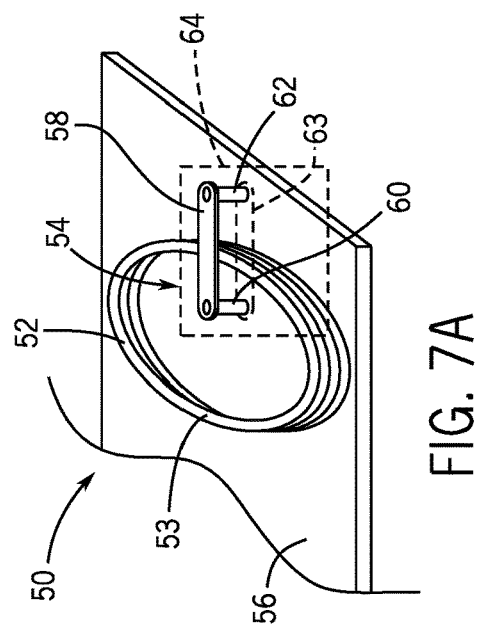

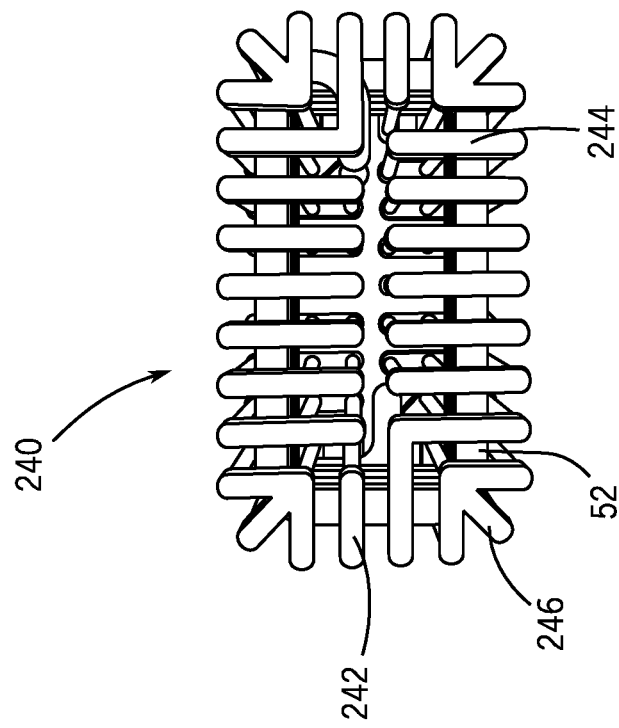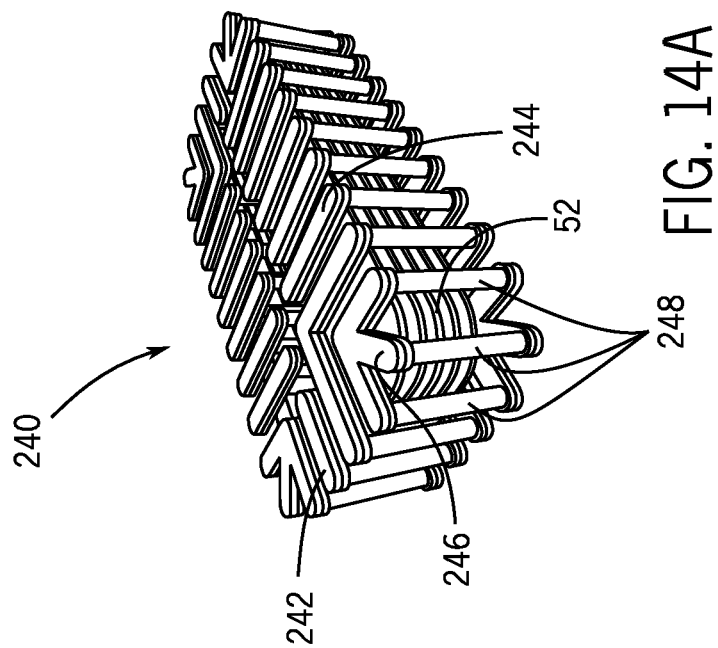

MAGNETIC FIELD CONTAINMENT INDUCTORS

CROSS-REFERENCE TO RELATED APPLICATION

This application claims priority to and benefit from U.S. Provisional Application No. 62/385,164, filed Sep. 8, 2016, entitled "Magnetic Field Containment Inductors," the contents of which is incorporated by reference in its entirety.

BACKGROUND

The present disclosure relates generally to power supply circuitry of an electronic device, and more particularly to containing a magnetic B-Field of an inductor of switching power supply circuitry.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Switching power supply circuitry is typically used in electronic devices for energy storage and conversion. Performance of an inductor of the switching power supply circuitry increases with higher saturation current in the inductor. In operation, the inductor emits a magnetic field that may disrupt neighboring circuit components. The magnetic field of the inductor may be contained using a structure made of a high relative permeability with sufficiently thick walls. However, employing such a structure will lower the saturation current of the inductor, reducing the performance of the inductor.

BRIEF DESCRIPTION OF THE DRAWINGS

Various aspects of this disclosure may be better understood upon reading the following detailed description and upon reference to the drawings in which:

FIG. 3 is a front view of a handheld device representing another embodiment of the electronic device of FIG. 1;

FIG. 4 is a front view of another handheld device representing another embodiment of the electronic device of FIG. 1;

FIG. 7A is a schematic diagram of a portion of an example of switching power supply circuitry of the electronic device of FIG. 1, in accordance with an embodiment of the present disclosure;

FIG. 7B is a schematic diagram of a portion of another example of switching power supply circuitry of the electronic device of FIG. 1, in accordance with an embodiment of the present disclosure;

FIG. 7C is a schematic diagram of a portion of yet another example of switching power supply circuitry of the electronic device of FIG. 1, in accordance with an embodiment of the present disclosure;

FIG. 14A is a diagram of a perspective view of a configuration of multiple magnetic field containment devices, in accordance with an embodiment of the present disclosure;

FIG. 14B is a diagram of a top view of the configuration of multiple magnetic field containment devices of FIG. 14A, in accordance with an embodiment of the present disclosure;

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The disclosed embodiments relate to systems and devices for at least partially containing a magnetic field of an inductor with magnetic field containment devices that enable a desired saturation current in the inductor. A relative permeability and dimensional reluctance of a magnetic field containment device affect a degree of containment of the magnetic field and saturation current of a portion of the inductor at least partially surrounded by the magnetic field containment device. Varying a material composition and/or structural characteristics of the magnetic field containment device may adjust the relative permeability and/or dimensional reluctance of the magnetic field containment device. The relative permeability and/or dimensional reluctance of the magnetic field containment device affects containment of the magnetic field and saturation current of the portion of the inductor at least partially surrounded by the magnetic field containment device.

Figure 1:
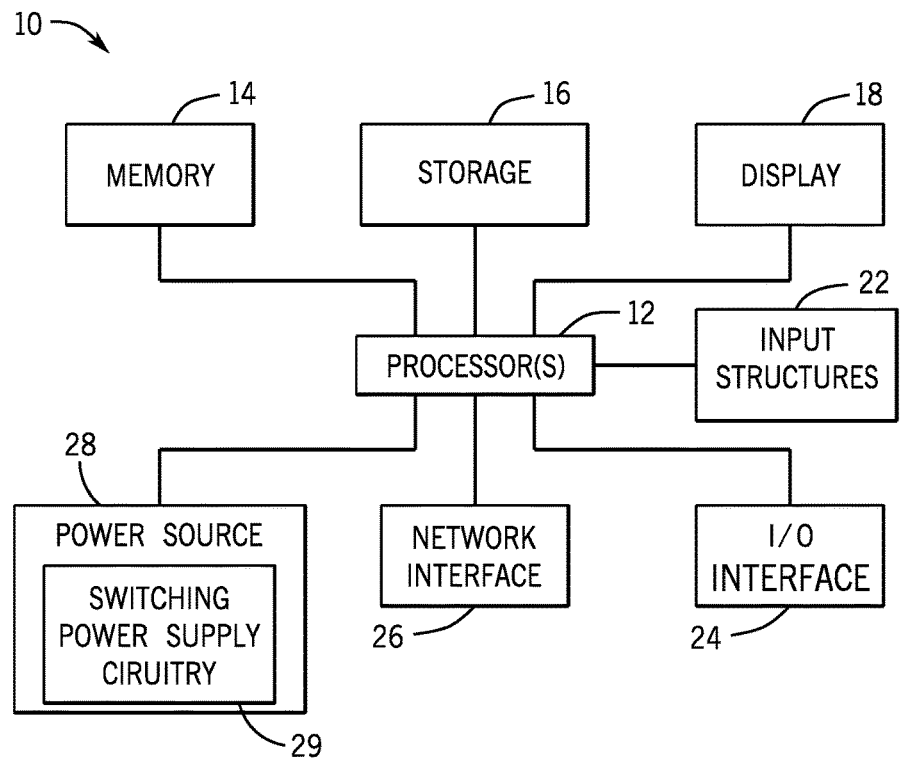
FIG. 1 is a block diagram of an electronic device, in accordance with an embodiment of the present disclosure.

With the preceding in mind, a general description of suitable electronic devices that may include and use the inductor and corresponding magnetic field containment devices is provided. FIG. 1 is a block diagram of an electronic device 10, in accordance with an embodiment of the present disclosure. The electronic device 10 may include, among other things, one or more processor(s) 12, memory 14, storage or nonvolatile memory 16, a display 18, input structures 22, an input/output (I/O) interface 24, network interface 26, and a power source 28 that includes switching power supply circuitry 29. The various functional blocks shown in FIG. 1 may include hardware elements (including circuitry), software elements (including computer code stored on a computer-readable medium), or a combination of both hardware and software elements. It should be noted that FIG. 1 is merely one example of a particular implementation and is intended to illustrate the types of components that may be present in electronic device 10.

Figure 2:
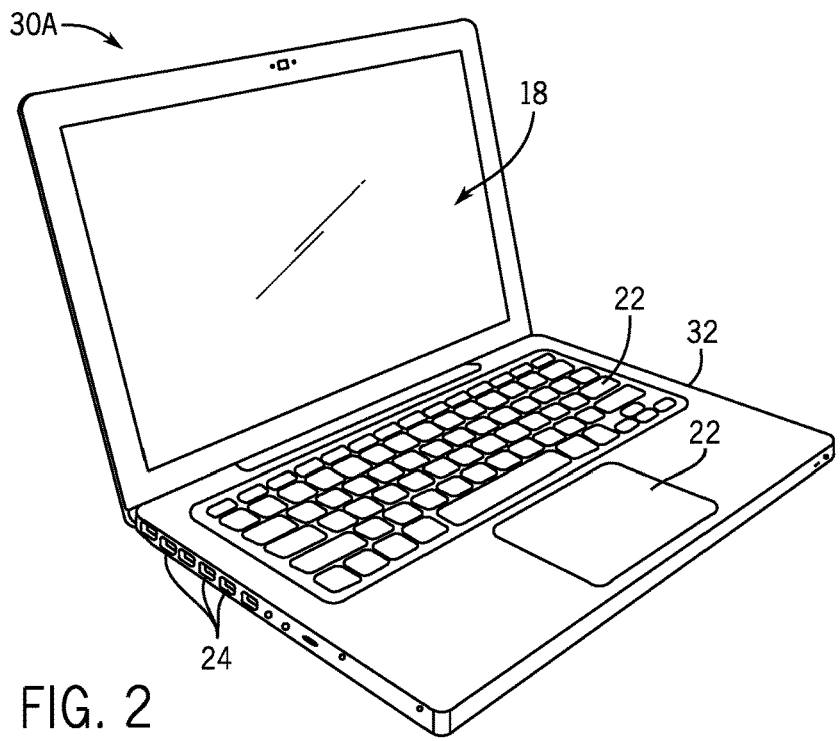
FIG. 2 is a perspective view of a notebook computer representing an embodiment of the electronic device of FIG. 1.
Figure 5:
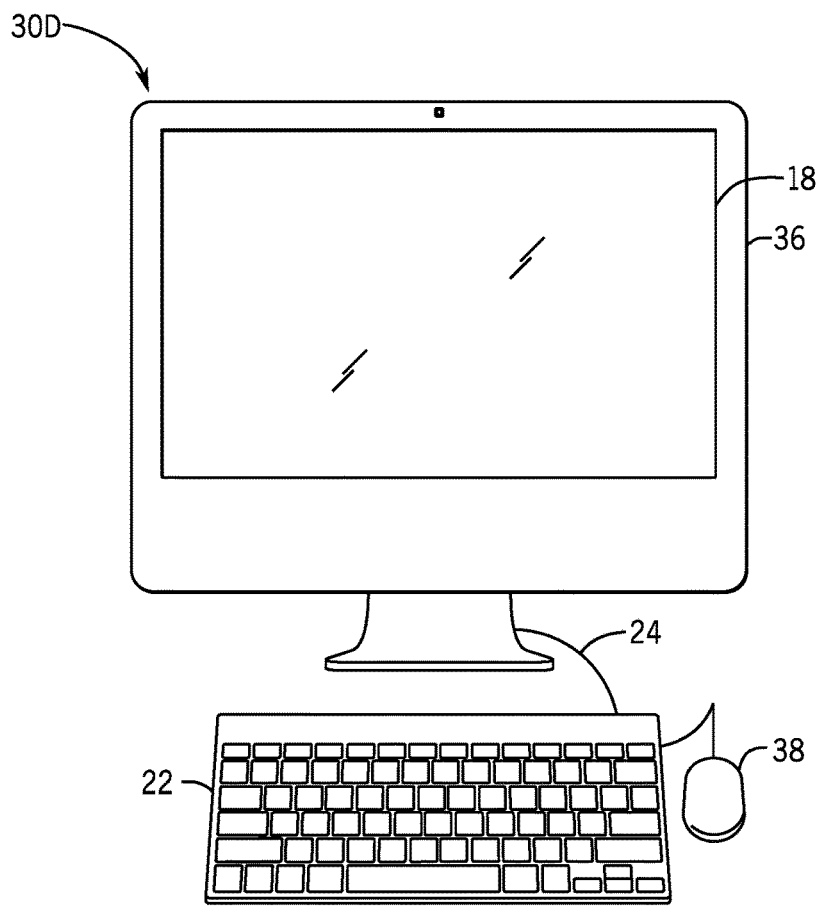
FIG. 5 is a front view of a desktop computer representing another embodiment of the electronic device of FIG. 1.
Figure 6:
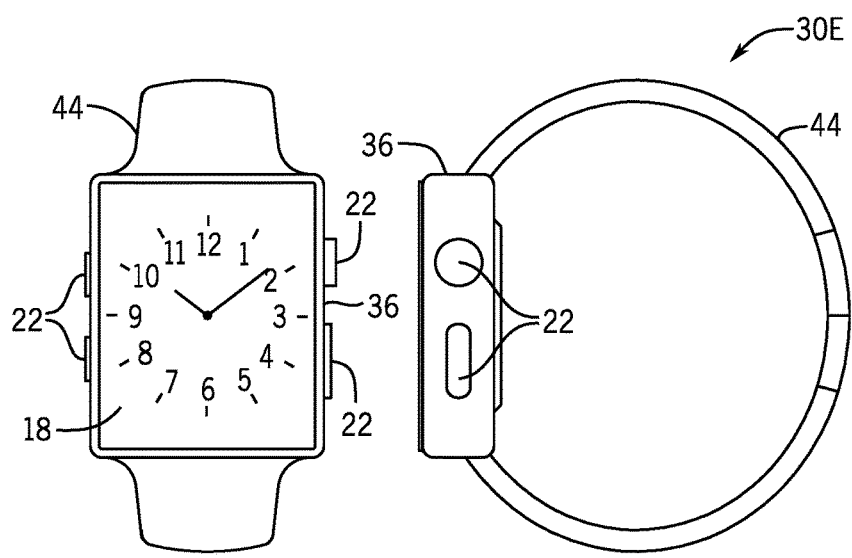
FIG. 6 is a front view of a wearable electronic device representing another embodiment of the electronic device of FIG. 1.

By way of example, the electronic device 10 may represent a block diagram of a notebook computer 30A depicted in FIG. 2, handheld devices 30B, 30C depicted in FIG. 3 and FIG. 4, a desktop computer 30D depicted in FIG. 5, a wearable electronic device 30E depicted in FIG. 6, or similar devices. It should be noted that the processor(s) 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 and/or other data processing circuitry may be operably coupled with the memory 14 and the nonvolatile storage 16 to perform various algorithms. Such programs or instructions executed by the processor(s) 12 may be stored in any suitable article of manufacture or computer program product that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on the memory 14 or the nonvolatile storage 16 may also include instructions that may be executed by the processor(s) 12 to enable the electronic device 10 to provide various functionalities.

In certain embodiments, the display 18 may be a liquid crystal display (e.g., LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more light emitting diode (e.g., LED, OLED, AMOLED, etc.) displays, or some combination of LCD panels and LED panels.

The input structures 22 of the electronic device 10 may enable a user to interact with the electronic device 10 (e.g., pressing a button to increase or decrease a volume level). The I/O interface 24 may enable electronic device 10 to interface with various other electronic devices. The I/O interface 24 may include various communications interfaces, such as universal serial bus (USB) ports, serial communications ports (e.g., RS232), Apple's Lightning® connector, or other communications interfaces. The network interface 26 may also enable electronic device 10 to interface with various other electronic devices and may include, for example, interfaces for a personal area network (e.g., PAN), such as a Bluetooth network, for a local area network (e.g., LAN) or wireless local area network (e.g., WLAN), such as an 802.11x Wi-Fi network, and/or for a wide area network (e.g., WAN), such as a $3^{rd}$ generation (e.g., 3G) cellular network, $4^{th}$ generation (e.g., 4G) cellular network, or long term evolution (e.g., LTE) cellular network. The network interface 26 may include an interface for, for example, broadband fixed wireless access networks (e.g., WiMAX), mobile broadband Wireless networks (e.g., mobile WiMAX), asynchronous digital subscriber lines (e.g., ADSL, VDSL), digital video broadcasting-terrestrial (DVB-T) and its extension DVB Handheld (DVB-H), ultra Wideband (UWB), alternating current (AC) power lines, and so forth.

As further illustrated, the electronic device 10 may include a power source 28. The power source 28 may include any suitable source of power, such as a rechargeable lithium polymer (e.g., Li-poly) battery and/or an alternating current (e.g., AC) power converter. The power source 28 may be removable, such as replaceable battery cell. The power source 28 may also include or be coupled to the switching power supply circuitry 29, which may be used to store and converting energy of the electronic device 10. As will be discussed further below, the switching power supply circuitry 29 may include an inductor and corresponding magnetic field containment devices. Although the inductor of the switching power supply circuitry 29 may emit a magnetic B-field that could interfere with other components of the electronic device 10, the magnetic field containment devices of the switching power supply circuitry 29 may contain the magnetic field emitted by the inductor, while enabling a desired saturation current of the inductor.

In certain embodiments, the electronic device 10 may take the form of a computer, a portable electronic device, a wearable electronic device, or other type of electronic device. Such computers may include computers that are generally portable (e.g., such as laptop, notebook, and tablet computers) as well as computers that are generally used in one place (e.g., such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of the notebook computer 30A, is illustrated in FIG. 2 in accordance with an embodiment of the present disclosure. The depicted computer 30A may include a housing or enclosure 32, a display 18, input structures 22, and ports of the I/O interface 24. In one embodiment, the input structures 22 (e.g., such as a keyboard and/or touchpad) may be used to interact with the computer 30A, such as to start, control, or operate a GUI or applications running on computer 30A. For example, a keyboard and/or touchpad may allow a user to navigate a user interface or application interface displayed on display 18.

FIG. 3 depicts a front view of a handheld device 30B, which represents an embodiment of the electronic device 10. The handheld device 30B may represent, for example, a portable phone, a media player, a personal data organizer, a handheld game platform, or any combination of such devices. By way of example, the handheld device 30B may be a model of an iPod® or iPhone® available from Apple Inc. of Cupertino, Calif. FIG. 4 depicts a front view of another handheld device 30C, which represents another embodiment of the electronic device 10. The handheld device 30C may represent, for example, a tablet computer, or one of various portable computing devices. By way of example, the handheld device 30C may be a tablet-sized embodiment of the electronic device 10, which may be, for example, a model of an iPad® available from Apple Inc. of Cupertino, Calif.

The handheld devices 30B and 30C may each include similar components. For example, an enclosure 36 may protect interior components from physical damage and to shield them from electromagnetic interference. The enclosure 36 may surround the display 18, which may display indicator icons 39. The indicator icons 39 may indicate, among other things, a cellular signal strength, Bluetooth connection, and/or battery life. The I/O interfaces 24 may open through the enclosure 36 and may include, for example, an I/O port for a hard wired connection for charging and/or content manipulation using a connector and protocol, such as the Lightning connector provided by Apple Inc., a universal service bus (e.g., USB), one or more conducted radio frequency connectors, or other connectors and protocols.

User input structures 22, 40, in combination with the display 18, may allow a user to control the handheld devices 30B or 30C. For example, the input structure 40 may activate or deactivate the handheld device 30B or 30C, one of the input structures 22 may navigate a user interface of the handheld device 30B or 30C to a home screen, a user-configurable application screen, and/or activate a voice-recognition feature of the handheld device 30B or 30C, while other of the input structures 22 may provide volume control, or may toggle between vibrate and ring modes. In the case of the handheld device 30B, additional input structures 22 may also include a microphone may obtain a user's voice for various voice-related features, and a speaker to allow for audio playback and/or certain phone capabilities. The input structures 22 may also include a headphone input to provide a connection to external speakers and/or headphones.

Turning to FIG. 5, a computer 30D may represent another embodiment of the electronic device 10 of FIG. 1. The computer 30D may take any suitable form of computer, such as a desktop computer, a server, or a notebook computer, but may also be a standalone media player or video gaming machine. By way of example, the computer 30D may be an iMac®, a MacBook®, or other similar device by Apple Inc. It should be noted that the computer 30D may also represent a personal computer (e.g., PC) by another manufacturer. A similar enclosure 36 may be provided to protect and enclose internal components of the computer 30D such as a dual-layer display. In certain embodiments, a user of the computer 30D may interact with the computer 30D using various peripheral input devices, such as input structures 22 (e.g., the keyboard or mouse 38), which may connect to the computer 30D via a wired and/or wireless I/O interface 24.

Similarly, FIG. 6 depicts a wearable electronic device 30E representing another embodiment of the electronic device 10 of FIG. 1 that may be configured to operate using the techniques described herein. By way of example, the wearable electronic device 30E, which may include a wristband 44, may be an Apple Watch® by Apple, Inc. However, in other embodiments, the wearable electronic device 30E may include any wearable electronic device such as, for example, a wearable exercise monitoring device (e.g., pedometer, accelerometer, heart rate monitor), or other device by another manufacturer. The display 18 of the wearable electronic device 30E may include a touch screen (e.g., LCD, OLED display, active-matrix organic light emitting diode (e.g., AMOLED) display, and so forth), which may allow users to interact with a user interface of the wearable electronic device 30E.

FIG. 7A is a schematic diagram of a portion 50 of an example of the switching power supply circuitry 29 of the electronic device 10 of FIG. 1 that includes an inductor 52 and a magnetic field containment device 54, in accordance with an embodiment of the present disclosure. The inductor 52 and the magnetic field containment device 54 may be mounted to a circuit board 56 of the portion 50 of the switching power supply circuitry 29. While only the portion 50 of the switching power supply circuitry 29 is shown, the switching power supply circuitry 29 may include other components on the circuit board 56, such as circuit traces, capacitors, resistors, input/output connectors, and the like. The switching power supply circuitry 29 may also include multiple inductors 52, and magnetic field containment devices 54 for each inductor 52. The inductor 52 includes a conductor 53 (e.g., a wire or coil) that may be wound in a toroidal fashion. When electrical current flows through the conductor 53, energy is stored in a magnetic field in the conductor 53. As illustrated, the inductor 52 includes a continuous conductor 53 wound in a substantially round toroid-shape.

The magnetic field containment device 54 may be made of any suitable material and have a structure that at least partially contains a magnetic field emitted by a portion of the inductor 52 that is at least partially surrounded by the magnetic field containment device 54, while enabling a desired saturation current of the portion of the inductor 52. For example, the suitable material may be a material that has a suitable or desired relative permeability. The higher the relative permeability of the material, the more effective the containment of the magnetic field. As a non-limiting example, the desired relative permeability of the magnetic field containment device 54 may be within a range of 10 to 10000 (e.g., 80, 120, 180, 200, 250, 300, 500, 1000, 1200, 2000, and the like).

However, a material with relative permeability that is too high may excessively lower the saturation current in the inductor 52 when in operation. As an example, a magnetic field containment device 54 made of a ferrite-based material (e.g., pure ferrite, $BaFe_{12}O_{19}$, and the like) may have a relative permeability of approximately 1000 and cause hysteresis losses when electrical current flows in the inductor 52. The hysteresis losses in turn result in undesirably lowering saturation current in the inductor 52. In some embodiments, it may be desirable for the magnetic field containment device 54, in operation, to enable a desired saturation current in the inductor 52 (e.g., the portion in the inductor 52 that is at least partially surrounded by the magnetic field containment device 54) that is greater or equal to 50 percent of the saturation current in the inductor 52 when not at least partially surrounded by the magnetic field containment device 54. For example, it may be desirable for the magnetic field containment device 54 to enable a saturation current in the inductor 52 that is greater or equal to 60 percent, 70 percent, 75 percent, 80 percent, 85 percent, 90 percent, or 95 percent, of the saturation current in the inductor 52 when not at least partially surrounded by the magnetic field containment device 54.

As illustrated, the structure of the magnetic field containment device 54 includes a top portion 58, an inner pillar 60, an outer pillar 62, that, along with a portion 63 of the circuit board 56 that abuts the inner pillar 60 and the outer pillar 62, at least partially surrounds or encloses the inductor 52 along a transverse plane 64 of the inductor 52. The portion 63 of the circuit board 56 may be made of any suitable material that has a higher permeability than a permeability of a typical circuit trace on the circuit board 56. For example, the portion 63 of the circuit board 56 may be made of the same material as the magnetic field containment device 54. In some embodiments, the portion 63 of the circuit board 56 may be made of a different material than the magnetic field containment device 54, and thus may have a lower or higher permeability compared to the magnetic field containment device 54.

Increasing a reluctance path of the magnetic field containment device 54 and the portion 63 of the circuit board 56 may contain more of the magnetic field emitted by the portion of the inductor 52 that is at least partially surrounded by the magnetic field containment device 54 and the portion 63 of the circuit board 56. The reluctance path may be increased by any combination of thickening the pillars 60, 62 of the magnetic field containment device 54, adding additional pillars, and the like. Varying or tuning the material composition and/or structure of the magnetic field containment device 54 may adjust the relative permeability and/or dimensional reluctance of the magnetic field containment device 54, respectively, such that the magnetic field containment device 54 may contain a desired portion of the magnetic field while enabling a desired saturation current in the portion of the inductor 52 at least partially surrounded by the magnetic field containment device 54. In some embodiments, the reluctance path may be broken or interrupted in one or more inner pillars (e.g., the pillar 60), such that there is one or more air gaps in the one or more inner pillars, to vary or tune the saturation current in the portion of the inductor 52. In some embodiments, other materials of different relative permeabilities may be used to form one or more portions (e.g., one or more pillars 60, 62) of the magnetic field containment device 54 to vary or tune the saturation current in the portion of the inductor 52. For example, the inner pillar 60 may be formed of a material having a different relative permeability than the relative permeability of the remainder of the magnetic field containment device 54 to enable a desired saturation current in the portion of the inductor 52.

Each magnetic field containment device 54 that at least partially surrounds the inductor 52 may be an independent electrical circuit that is not directly electrically connected (e.g., via a conductor) to any other magnetic field containment device 54. For example, there may be physical separation between any two magnetic field containment devices 54 at least partially surrounding an inductor 52. In some embodiments, the magnetic field containment device 54 and/or the inductor 52 may be part of the circuit board 56. For example, the magnetic field containment device 54, the inductor 52, and/or the circuit board 56 may be manufactured together to reduce manufacturing costs.

FIG. 7B is a portion 70 of another example of the switching power supply circuitry 29 of the electronic device 10 of FIG. 1 that includes an inductor 52 with a conductor 53 that is not continuous and the magnetic field containment device 54 having a different structure than in FIG. 7A, in accordance with an embodiment of the present disclosure. In particular, the inductor 52 is not continuous, and has a first end 71 and a second end 72. The magnetic field containment device 54 includes the top portion 58 coupled to the inner pillar 60 and the outer pillar 62, wherein the inner pillar 60 and the outer pillar 62 mount the top portion 58 to a top surface 73 circuit board 56. The magnetic field containment device 54 also includes a bottom portion 74 coupled to a bottom inner pillar 76 and a bottom outer pillar 78 mounted to a bottom surface 80 of the circuit board 56. The inner pillar 60 may be coupled to the bottom inner pillar 76 and the outer pillar 62 may be coupled to the bottom outer pillar 78. In some embodiments, the bottom inner pillar 76 is part of the inner pillar 60 and the bottom outer pillar 78 is part of the outer pillar 62. In this configuration, the magnetic field containment device 54 surrounds or encloses a greater portion of the inductor 52 (compared to the magnetic field containment device 54 of FIG. 7A) along a transverse plane 84, and may more effectively contain the magnetic field emitted by the portion 82 of the inductor 52.

FIG. 7C is a portion 90 of yet another example of the switching power supply circuitry 29 of the electronic device 10 of FIG. 1 that includes an inductor 52 with a conductor 53 wound in a different shape and the magnetic field containment device 54 having a different structure than in FIG. 7A, in accordance with an embodiment of the present disclosure. In particular, the conductor 53 is wound in a substantially rectangular toroid-shape. The magnetic field containment device 54 includes the top portion 58 and a bottom portion 74 coupled to the inner pillar 60 and the outer pillar 62, wherein the inner pillar 60 and the outer pillar 62 mount the top portion 58 and the bottom portion 74 to the top surface 73 circuit board 56. In this configuration, the magnetic field containment device 54 completely or fully surrounds or encloses a portion of the inductor 52 along a transverse plane 88, and may more effectively contain (compared to the magnetic field containment device 54 of FIGS. 7A-B) the magnetic field emitted by the portion of the inductor 52.

Figure 8:
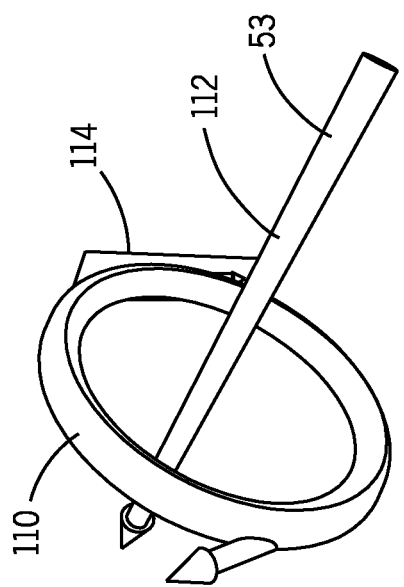
FIG. 8 is a diagram of a B-Field generated by electrical current flowing in a conductor, in accordance with an embodiment of the present disclosure.

FIG. 8 is a diagram of a magnetic B-Field 110 generated by electrical current 112 flowing in a conductor, in accordance with an embodiment of the present disclosure. The conductor may be the conductor 53 of the inductor 52. A nearby conductive plate 114 may be, for example, an inner surface of the magnetic field containment device 54 of FIG. 7A, 7B, or 7C.

Figure 9:
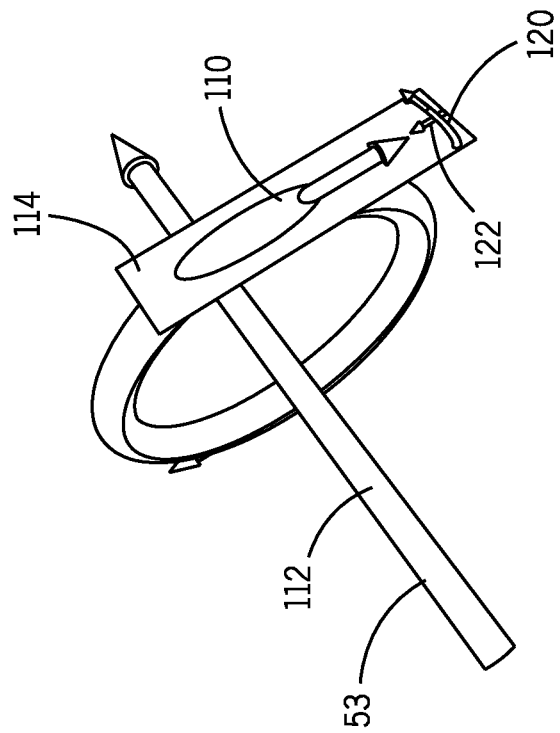
FIG. 9 is a diagram of an eddy current and opposing B-Field generated by the B-Field of FIG. 8, in accordance with an embodiment of the present disclosure.

FIG. 9 is a diagram of an eddy current 120 and opposing B-Field 122 generated by the B-Field 110 in the nearby conductive plate 114 of FIG. 8, in accordance with an embodiment of the present disclosure. The B-Field 110 interacts with the nearby conductive plate 114, generating the eddy current 120. The eddy current 120 in turn generates the opposing B-Field 122. Because the opposing B-Field 122 opposes the B-Field generated by the electrical current 112 flowing in the conductor 53, the eddy current 120 causes conducted losses (e.g., in the nearby conductive plate 114).

Figure 10B:
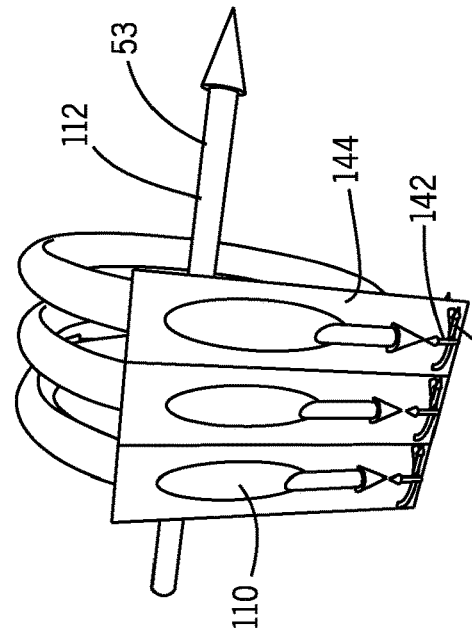
FIG. 10B is a diagram of eddy currents and opposing B-Fields generated by the B-Field of FIG. 10A, in accordance with an embodiment of the present disclosure.
Figure 10A:
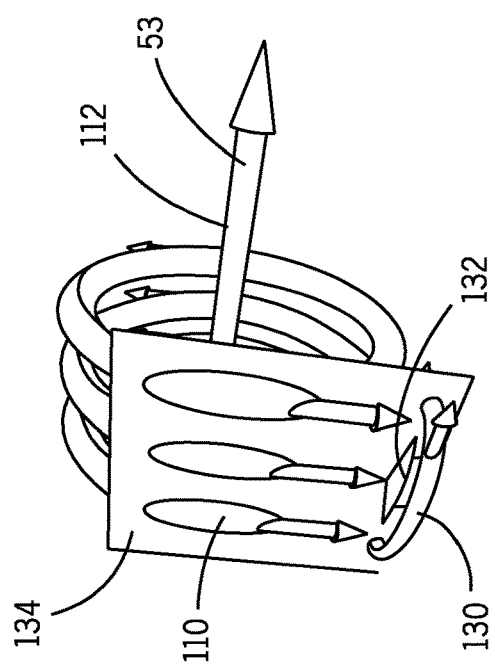
FIG. 10A is a diagram of an eddy current and opposing B-Field generated by the B-Field of FIG. 8, in accordance with an embodiment of the present disclosure.

FIG. 10A is a diagram of an eddy current 130 and opposing B-Field 132 generated by the B-Field 110 in a wider nearby conductive plate 134 of FIG. 8, in accordance with an embodiment of the present disclosure. The size of a nearby conductive plate determines the strength of the eddy current and the opposing B-Field generated by the B-Field 110. Because the wider nearby conductive plate 134 is wider than the nearby conductive plate 114 of FIG. 9, the wider nearby conductive plate 134 provides a larger eddy current path, producing a stronger eddy current 130 and stronger opposing B-Field 132, and thus greater conducted losses (e.g., in the wider nearby conductive plate 134).

FIG. 10B is a diagram of eddy currents 140 and opposing B-Fields 142 generated by the B-Field 110 when the wider nearby conductive plate 134 of FIG. 10A is split into multiple thinner nearby conductive plates 144, in accordance with an embodiment of the present disclosure. The size of a nearby conductive plate determines the strength of the eddy current and the opposing B-Field generated by the B-Field 110. Because the wider nearby conductive plate 134 of FIG. 10A is split into multiple thinner nearby conductive plates 144, the multiple thinner nearby conductive plates 144 result in smaller eddy current paths and less conducted losses (due to smaller current paths). Additionally, each opposing B-Field 142 may partially negate its neighboring opposing B-Field 142 where the conductive plates 144 are separated. Thus, making thinner slices of magnetic field containment device 54 that at least partially surround or enclose the conductor 53 of the inductor 52 may further reduce conducted losses.

FIGS. 11A-D are diagrams of magnetic field containment of magnetic field containment devices 54 made of materials of different relative permeability that surround two portions of an inductor 52, in accordance with an embodiment of the present disclosure. The materials may be any suitable materials that have a desired relative permeability. The higher the relative permeability of the material, the more effective the containment of the magnetic field. However, if the relative permeability of the material is too high, the material may excessively lower the saturation current in the inductor 52 when in operation. As an example, a magnetic field containment device 54 made of a ferrite-based material (e.g., pure ferrite, $BaFe_{12}O_{19}$, and the like) may have a relative permeability of approximately 1000 and cause hysteresis losses when electrical current flows in the inductor 52. The hysteresis losses in turn result in undesirably decreasing the saturation current in the inductor 52. As such, a material that has an excessively high relative permeability and thus causes excessive hysteresis loss, such that the saturation current in the inductor 52 is decreased beyond what is desired, should be avoided.

Suitable materials may include any combination of cobalt, tantalum, zirconium, niobium, nickel, ferrite, silicon, vanadium, molybdenum, boron, carbon, manganese, zinc, copper, chromium, phosphorus, aluminum, and the like. Suitable materials may include alloys from any of the following alloy families: CoTaZr, CoNbZr, $Ni_{81}Fe_{19}$, Fe-(3-4)Si, $Co_{48}$Fe-2V, Fe-(45-50)Ni, Ni-17Fe-4Mo, Fe-13.5B-2.5Si-2C, Co-15Si-14B, ferrites (Mn, Ni—Zn), Ni-5Cu-2Cr, Fe—P, Fe-13.5Si-9B-3Nb-Cu, Fe-9.5Si-5.5Al, CoP, Fe (17-50)Co, Fe-(17-18)Cr, Fe-12Cr, and the like. For example, the magnetic field containment devices 54 in FIGS. 11A-11D may be made of a combination of nickel, ferrite, and copper (NiFeCu). The exact composition and/or proportion of elements of the combination of nickel, ferrite, and copper may be varied or tuned to achieve a desired relative permeability.

Figure 11A:
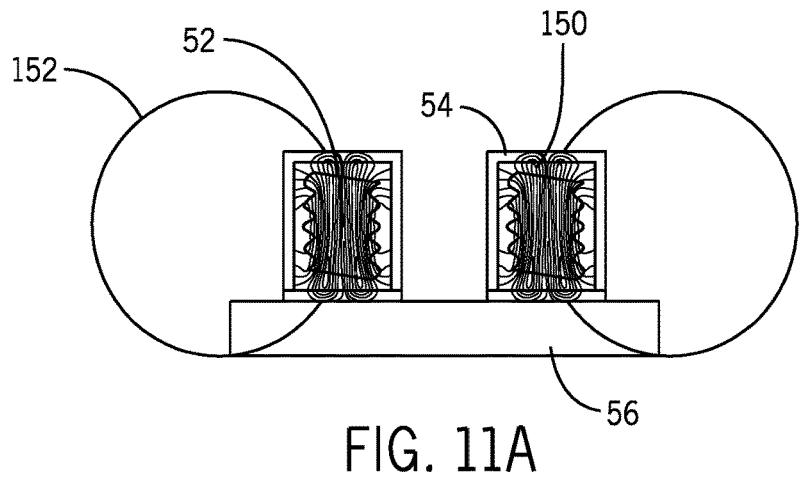
FIG. 11A is a diagram of magnetic field containment of magnetic field containment devices, in accordance with an embodiment of the present disclosure.

FIG. 11A is a diagram of the magnetic field containment of the magnetic field containment devices 54 that have a relative permeability of 80 that surround two portions of an inductor 52, in accordance with an embodiment of the present disclosure. The magnetic field containment devices 54 and the inductor 52 may be mounted to the circuit board 56. As illustrated, a portion 150 of the B-Field generated by the current in the inductor 52 is contained within the magnetic field containment devices 54, while another portion 152 of the B-Field is not contained within the magnetic field containment devices 54. The magnetic field containment devices 54 may be made of a combination of nickel, ferrite, and copper (NiFeCu). By adjusting the composition and/or proportion of elements of the materials of the magnetic field containment devices 54, a desired relative permeability may be achieved.

Figure 11B:
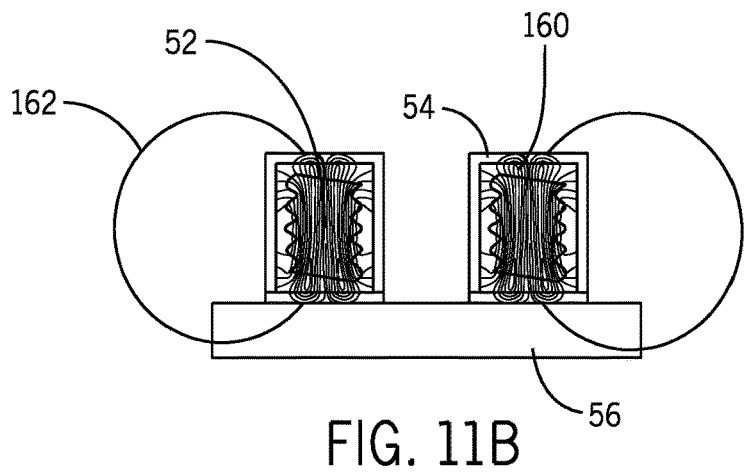
FIG. 11B is a diagram of the magnetic field containment of magnetic field containment devices, in accordance with an embodiment of the present disclosure.

FIG. 11B is a diagram of the magnetic field containment of the magnetic field containment devices 54 that have a relative permeability of 90 that surround two portions of the inductor 52 of FIG. 11A, in accordance with an embodiment of the present disclosure. As illustrated, a portion 160 of the B-Field generated by the current in the inductor 52 is contained within the magnetic field containment devices 54, while another portion 162 of the B-Field is not contained within the magnetic field containment devices 54. Due to the higher relative permeability of the material of the magnetic field containment devices 54 in FIG. 11B, the B-Field generated as a result of current flowing in the inductor 52 is weaker or less than the B-Field illustrated in FIG. 11A (as illustrated by the portions 152, 162 of the B-Field that is not contained within the magnetic field containment devices 54). As such, the weaker B-Field generated by the inductor 52 in FIG. 11B is less likely to interfere with neighboring circuit components than the B-Field generated by the inductor 52 in FIG. 11A.

Figure 11C:
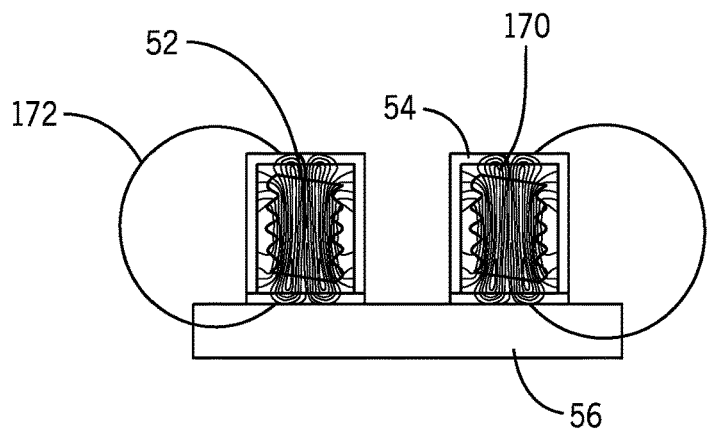
FIG. 11C is a diagram of the magnetic field containment of magnetic field containment devices, in accordance with an embodiment of the present disclosure.

FIG. 11C is a diagram of the magnetic field containment of the magnetic field containment devices 54 that have a relative permeability of 100 that surround two portions of the inductor 52 of FIG. 11A, in accordance with an embodiment of the present disclosure. As illustrated, a portion 170 of the B-Field generated by the current in the inductor 52 is contained within the magnetic field containment devices 54, while another portion 172 of the B-Field is not contained within the magnetic field containment devices 54. Due to the higher relative permeability of the material of the magnetic field containment devices 54 in FIG. 11C, the B-Field generated as a result of current flowing in the inductor 52 is weaker or less than the B-Field illustrated in FIG. 11B (as illustrated by the portions 162, 172 of the B-Field that is not contained within the magnetic field containment devices 54). As such, the weaker B-Field generated by the inductor 52 in FIG. 11C is less likely to interfere with neighboring circuit components than the B-Field generated by the inductor 52 in FIG. 11B.

Figure 11D:
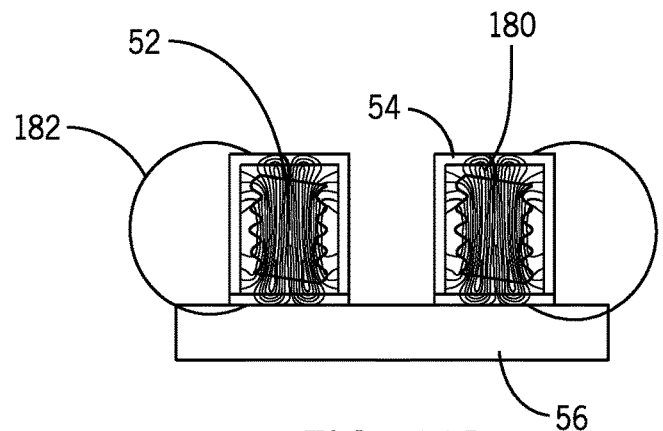
FIG. 11D is a diagram of the magnetic field containment of magnetic field containment devices, in accordance with an embodiment of the present disclosure.

FIG. 11D is a diagram of the magnetic field containment of the magnetic field containment devices 54 that have a relative permeability of 120 that surround two portions of the inductor 52 of FIG. 11A, in accordance with an embodiment of the present disclosure. As illustrated, a portion 180 of the B-Field generated by the current in the inductor 52 is contained within the magnetic field containment devices 54, while another portion 182 of the B-Field is not contained within the magnetic field containment devices 54. Due to the higher relative permeability of the material of the magnetic field containment devices 54 in FIG. 11D, the B-Field generated as a result of current flowing in the inductor 52 is weaker or less than the B-Field illustrated in FIG. 11C (as illustrated by the portions 172, 182 of the B-Field that is not contained within the magnetic field containment devices 54). As such, the weaker B-Field generated by the inductor 52 in FIG. 11D is less likely to interfere with neighboring circuit components than the B-Field generated by the inductor 52 in FIG. 11C.

FIGS. 12A-D are diagrams of magnetic field containment of the magnetic field containment devices 54 of FIGS. 11A-D, respectively, that additionally include an inner reluctance path, in accordance with an embodiment of the present disclosure. For example, an inner pillar may be added to the magnetic field containment device 54 such that the magnetic field containment device 54 includes three pillars (e.g., the inner pillar, an intermediate pillar, and an outer pillar). The added inner pillar may relieve an inner path of reluctance and result in reducing or "pulling in" the B-Fields not contained within the magnetic field containment device 54.

Figure 12A:
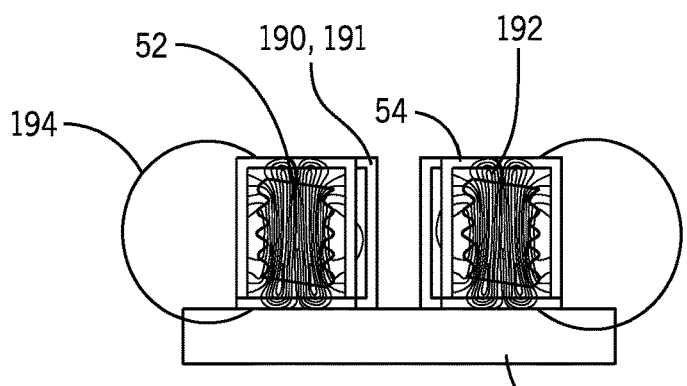
FIG. 12A is a diagram of the magnetic field containment of the magnetic field containment devices of FIG. 11A that includes an inner reluctance path, in accordance with an embodiment of the present disclosure.

FIG. 12A is a diagram of the magnetic field containment of the magnetic field containment devices 54 of FIG. 11A that additionally include the inner reluctance path 190, in accordance with an embodiment of the present disclosure. That is, the magnetic field containment devices 54 are made of a material that has a relative permeability of 80 that surround two portions of an inductor 52, in accordance with an embodiment of the present disclosure. The magnetic field containment devices 54 also each include an inner pillar 191 that relieves an inner path of reluctance and results in reducing the B-Fields emitted by the current 112 flowing in the inductor 52. As illustrated, a portion 192 of the B-Field generated by the current 112 in the inductor 52 is contained within the magnetic field containment devices 54, while another portion 194 of the B-Field is not contained within the magnetic field containment devices 54. Due to the additional inner pillar 191 of the magnetic field containment devices 54 in FIG. 12A, the B-Field generated as a result of current 112 flowing in the inductor 52 is weaker or less than the B-Field illustrated in FIG. 11A. As such, the weaker B-Field generated by the inductor 52 in FIG. 12A is less likely to interfere with neighboring circuit components than the B-Field generated by the inductor 52 in FIG. 11A.

Figure 12B:
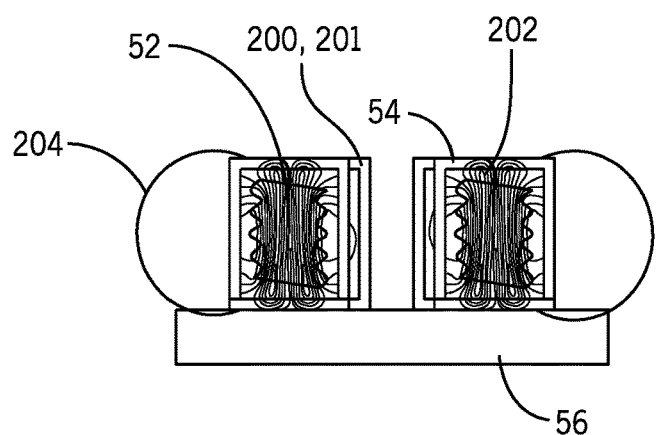
FIG. 12B is a diagram of the magnetic field containment of the magnetic field containment devices of FIG. 11B that includes an inner reluctance path, in accordance with an embodiment of the present disclosure.

FIG. 12B is a diagram of the magnetic field containment of the magnetic field containment devices 54 of FIG. 11B that additionally include the inner reluctance path 200, in accordance with an embodiment of the present disclosure. That is, the magnetic field containment devices 54 are made of a material that has a relative permeability of 90 that surround two portions of an inductor 52, in accordance with an embodiment of the present disclosure. The magnetic field containment devices 54 also each include an inner pillar 201 that relieves an inner path of reluctance and results in reducing the B-Fields emitted by the current 112 flowing in the inductor 52. As illustrated, a portion 202 of the B-Field generated by the current 112 in the inductor 52 is contained within the magnetic field containment devices 54, while another portion 204 of the B-Field is not contained within the magnetic field containment devices 54. Due to the additional inner pillar 201 of the magnetic field containment devices 54 in FIG. 12B, the B-Field generated as a result of current 112 flowing in the inductor 52 is weaker or less than the B-Field illustrated in FIG. 11B. Due to the higher relative permeability of the material of the magnetic field containment devices 54 in FIG. 12B, the B-Field generated as a result of current 112 flowing in the inductor 52 is weaker or less than the B-Field illustrated in FIG. 12A. As such, the weaker B-Field generated by the inductor 52 in FIG. 12B is less likely to interfere with neighboring circuit components than the B-Fields generated by the inductor 52 in FIG. 11B or FIG. 12A.

Figure 12C:
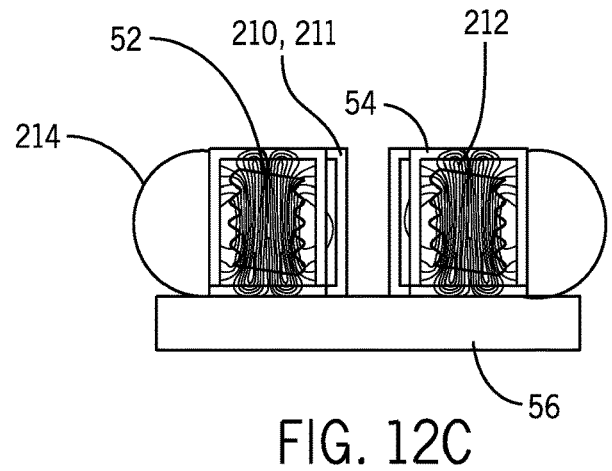
FIG. 12C is a diagram of the magnetic field containment of the magnetic field containment devices of FIG. 11C that includes an inner reluctance path, in accordance with an embodiment of the present disclosure.

FIG. 12C is a diagram of the magnetic field containment of the magnetic field containment devices 54 of FIG. 11C that additionally include the inner reluctance path 210, in accordance with an embodiment of the present disclosure. That is, the magnetic field containment devices 54 are made of a material that has a relative permeability of 100 that surround two portions of an inductor 52, in accordance with an embodiment of the present disclosure. The magnetic field containment devices 54 also each include an inner pillar 211 that relieves an inner path of reluctance and results in reducing the B-Fields emitted by the current 112 flowing in the inductor 52. As illustrated, a portion 212 of the B-Field generated by the current 112 in the inductor 52 is contained within the magnetic field containment devices 54, while another portion 214 of the B-Field is not contained within the magnetic field containment devices 54. Due to the additional inner pillar 211 of the magnetic field containment devices 54 in FIG. 12C, the B-Field generated as a result of current 112 flowing in the inductor 52 is weaker or less than the B-Field illustrated in FIG. 11C. Due to the higher relative permeability of the material of the magnetic field containment devices 54 in FIG. 12C, the B-Field generated as a result of current 112 flowing in the inductor 52 is weaker or less than the B-Field illustrated in FIG. 12B. As such, the weaker B-Field generated by the inductor 52 in FIG. 12C is less likely to interfere with neighboring circuit components than the B-Fields generated by the inductor 52 in FIG. 11C or FIG. 12B.

Figure 12D:
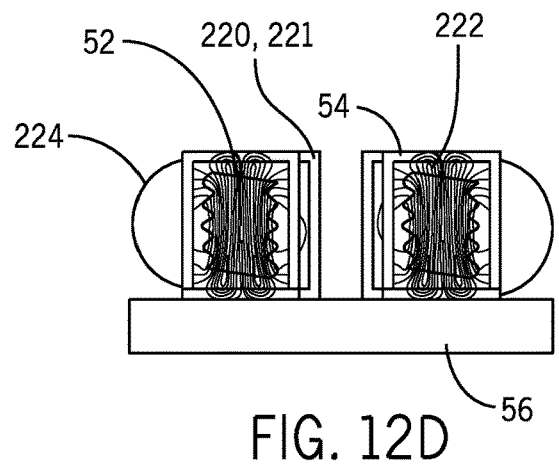
FIG. 12D is a diagram of the magnetic field containment of the magnetic field containment devices of FIG. 11D that includes an inner reluctance path, in accordance with an embodiment of the present disclosure.

FIG. 12D is a diagram of the magnetic field containment of the magnetic field containment devices 54 of FIG. 11D that additionally include the inner reluctance path 220, in accordance with an embodiment of the present disclosure. That is, the magnetic field containment devices 54 are made of a material that has a relative permeability of 120 that surround two portions of an inductor 52, in accordance with an embodiment of the present disclosure. The magnetic field containment devices 54 also each include an inner pillar 221 that relieves an inner path of reluctance and results in reducing the B-Fields emitted by the current 112 flowing in the inductor 52. As illustrated, a portion 222 of the B-Field generated by the current 112 in the inductor 52 is contained within the magnetic field containment devices 54, while another portion 224 of the B-Field is not contained within the magnetic field containment devices 54. Due to the additional inner pillar 221 of the magnetic field containment devices 54 in FIG. 12D, the B-Field generated as a result of current 112 flowing in the inductor 52 is weaker or less than the B-Field illustrated in FIG. 11D. Due to the higher relative permeability of the material of the magnetic field containment devices 54 in FIG. 12D, the B-Field generated as a result of current 112 flowing in the inductor 52 is weaker or less than the B-Field illustrated in FIG. 12C. As such, the weaker B-Field generated by the inductor 52 in FIG. 12D is less likely to interfere with neighboring circuit components than the B-Fields generated by the inductor 52 in FIG. 11D or FIG. 12C.

A magnetic field containment device made with a material of lower relative permeability may nevertheless effectively contain a B-Field generated by the current in the inductor 52 if the magnetic field containment device includes the additional inner reluctance path. For example, the magnetic field containment devices of FIG. 12B, which have a relative permeability of 90 and the additional inner reluctance path 220, contain similar amounts of B-Field as the magnetic field containment devices of FIG. 11D which have a relative permeability of 120 and no additional inner reluctance path.

Figure 13:
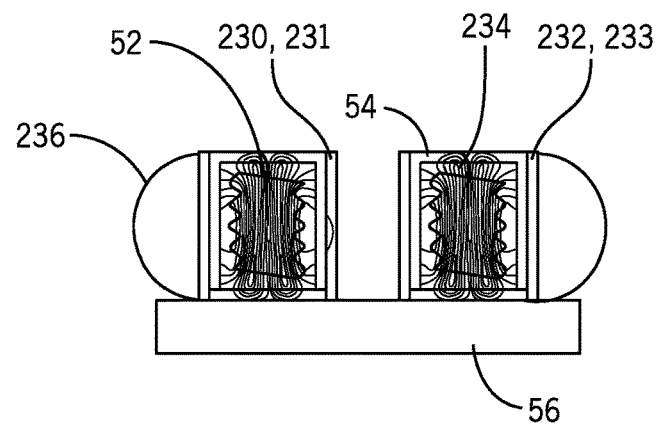
FIG. 13 is a diagram of the magnetic field containment of the magnetic field containment devices of FIG. 11A that includes an inner reluctance path and an outer reluctance path, in accordance with an embodiment of the present disclosure.

FIG. 13 is a diagram of the magnetic field containment of the magnetic field containment devices 54 of FIG. 11A that additionally includes the inner reluctance path 230 and an outer reluctance path 232, in accordance with an embodiment of the present disclosure. That is, the magnetic field containment devices 54 are made of a material that has a relative permeability of 80 that surround two portions of an inductor 52, in accordance with an embodiment of the present disclosure. The magnetic field containment devices 54 also each include an inner pillar 231 that relieves an inner path of reluctance and an outer pillar 233 that relieves an outer path of reluctance that result in reducing the B-Fields not contained within the magnetic field containment device 54. As illustrated, a portion 234 of the B-Field generated by the current in the inductor 52 is contained within the magnetic field containment devices 54, while another portion 236 of the B-Field is not contained within the magnetic field containment devices 54. However, the outer pillar 233 increases the surface area taken up by the magnetic field containment device 54 on the circuit board 56, whereas the inner pillar 231 does not.

Figure 14C:
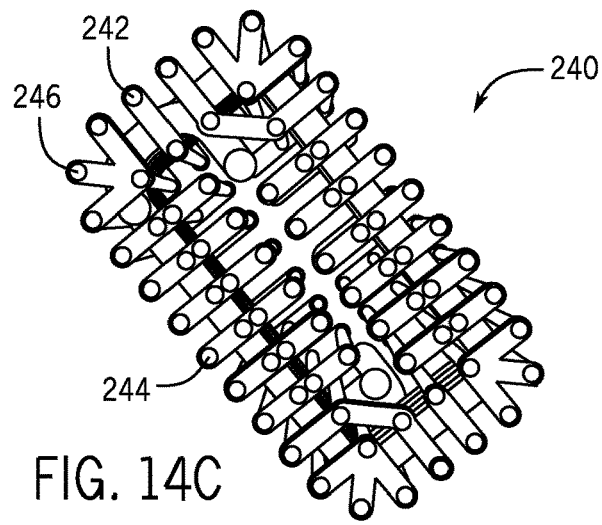
FIG. 14C is a diagram of a bottom view of the configuration of multiple magnetic field containment devices of FIG. 14A, in accordance with an embodiment of the present disclosure.

FIG. 14A is a diagram of a perspective view of a configuration 240 of multiple magnetic field containment devices used to at least partially contain the magnetic field emitted by the inductor 52, in accordance with an embodiment of the present disclosure. As illustrated, the inductor 52 may include multiple layers to increase inductance and performance of the inductor 52. As illustrated, the configuration 240 includes magnetic field containment devices of different structures. A first magnetic field containment device 242 includes a top portion coupled to a bottom portion by an inner pillar and an outer pillar that surrounds the inductor 52. That is, the first magnetic field device 242 may have a similar structure to that of the magnetic field device 54 of FIGS. 11A-D. A second magnetic field containment device 244 includes a top portion coupled to a bottom portion by an inner pillar, an intermediate pillar, and an outer pillar, where the top portion, the bottom portion, the intermediate pillar, and the outer pillar surrounds the inductor 52. That is, the second magnetic field device 244 may have a similar structure to that of the magnetic field device 54 of FIGS. 12A-D. Other magnetic field containment devices of the configuration 240 may include structures configured to accommodate the shape or configuration of the inductor 52. For example, the inductor 52 in FIGS. 14A-D has a rectangular toroid-shape. As such, the structure of the magnetic field containment device may be configured for a corner of the rectangular toroid-shape. A third magnetic field containment device 246 includes a top portion coupled to a bottom portion by an inner pillar and three outer pillars 248, where the top portion, the bottom portion, the intermediate pillar, and each outer pillar surrounds the inductor 52. It may be desirable to use magnetic field containment devices with inner reluctance paths (such as the second magnetic field device 244). However, due the shape of the inductor 52 may limit such use. Each magnetic field containment device (including 242, 244, 246) may be made of a material that has a desired relative permeability. In some embodiments, because each of the magnetic field containment devices may not be of the same structure, the material may be varied among the magnetic field containment devices such that each magnetic field containment device contains a uniform amount of B-Field generated by the inductor 52 while enabling a desired saturation current in the inductor 52.

Figure 14D:
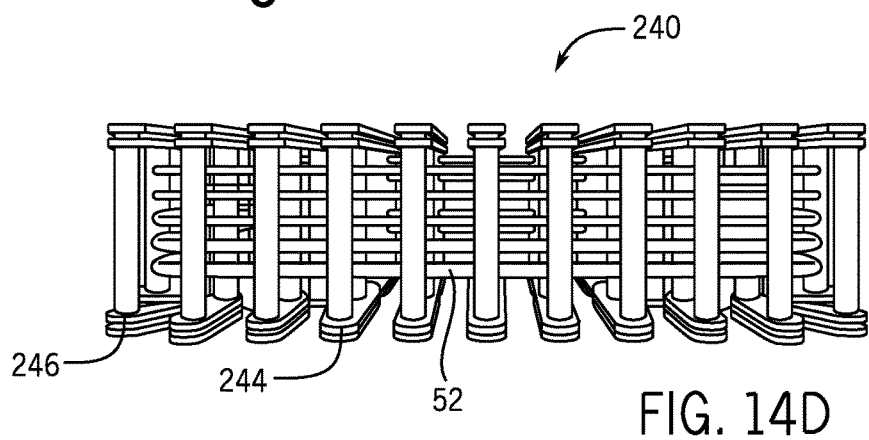
FIG. 14D is a diagram of a side view of the configuration of multiple magnetic field containment devices of FIG. 14A, in accordance with an embodiment of the present disclosure.

FIG. 14B is a diagram of a top view of the configuration 240 of the multiple magnetic field containment devices of FIG. 14A, in accordance with an embodiment of the present disclosure. FIG. 14C is a diagram of a bottom view of the configuration 240 of multiple magnetic field containment devices of FIG. 14A, in accordance with an embodiment of the present disclosure. FIG. 14D is a diagram of a side view of the configuration 240 of multiple magnetic field containment devices of FIG. 14A, in accordance with an embodiment of the present disclosure.

Figure 15A:
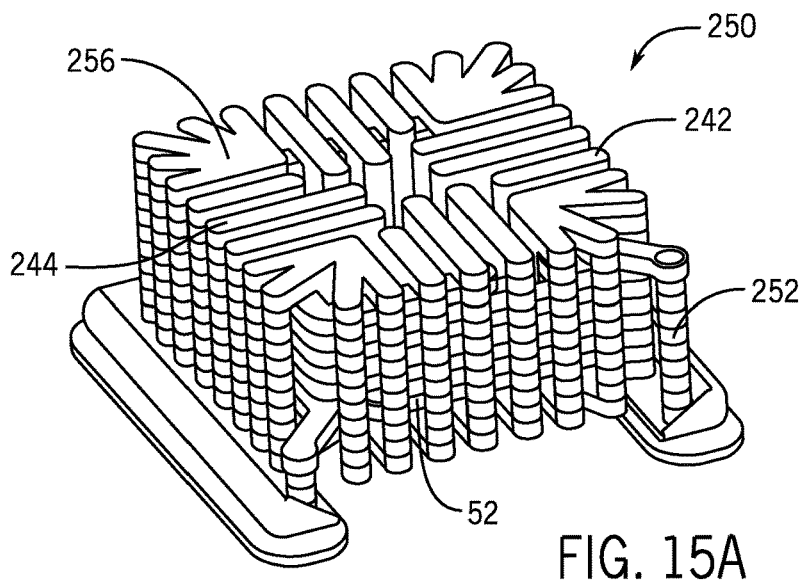
FIG. 15A is a diagram of a perspective view of a configuration of multiple magnetic field containment devices, in accordance with an embodiment of the present disclosure.

FIG. 15A is a diagram of a perspective view of another configuration 250 of multiple magnetic field containment devices used to at least partially contain the magnetic field emitted by the inductor 52, in accordance with an embodiment of the present disclosure. As illustrated, the inductor 52 may include multiple layers to increase inductance and thus performance of the inductor 52. As illustrated, the configuration 250 includes magnetic field containment devices of different structures. The configuration 250 includes the first magnetic field containment device 242 and the second magnetic field containment device 244 of FIGS. 14A-D. The inductor 52 in FIGS. 15A-B has a rectangular toroid-shape. As such, the structure of a magnetic field containment device may be configured for a corner of the rectangular toroid-shape. The magnetic field containment device may also be configured for features of the inductor 52, such as one or more connections 252 to a power source. A third magnetic field containment device 254 includes a top portion coupled to a bottom portion by an inner pillar and four outer pillars, where the top portion, the bottom portion, the intermediate pillar, and each outer pillar surrounds the inductor 52. A fourth magnetic field containment device 256 includes a top portion coupled to a bottom portion by an inner pillar and five outer pillars, where the top portion, the bottom portion, the intermediate pillar, and each outer pillar surrounds the inductor 52. Each magnetic field containment device (including 242, 244, 254, 256) may be made of a material that has a desired relative permeability. In some embodiments, because each of the magnetic field containment devices may not be of the same structure, the material may be varied among the magnetic field containment devices such that each magnetic field containment device contains a uniform amount of B-Field generated by the inductor 52 while enabling a desired saturation current in the inductor 52.

Figure 15B:
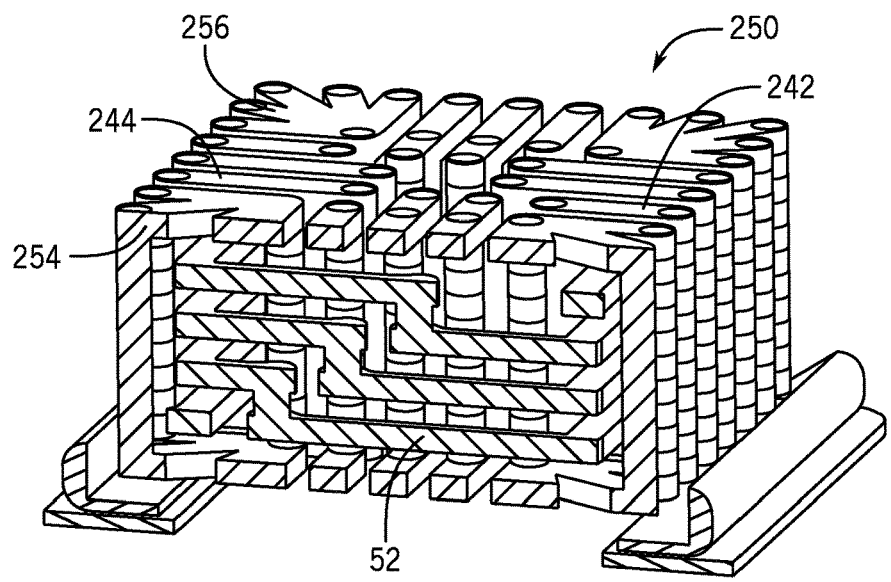
FIG. 15B is a perspective diagram of a cross-sectional view of the configuration of multiple magnetic field containment devices of FIG. 15A, in accordance with an embodiment of the present disclosure.

FIG. 15B is a perspective diagram of a cross-sectional view of the configuration 250 of multiple magnetic field containment devices of FIG. 15A, in accordance with an embodiment of the present disclosure.

Figure 16:
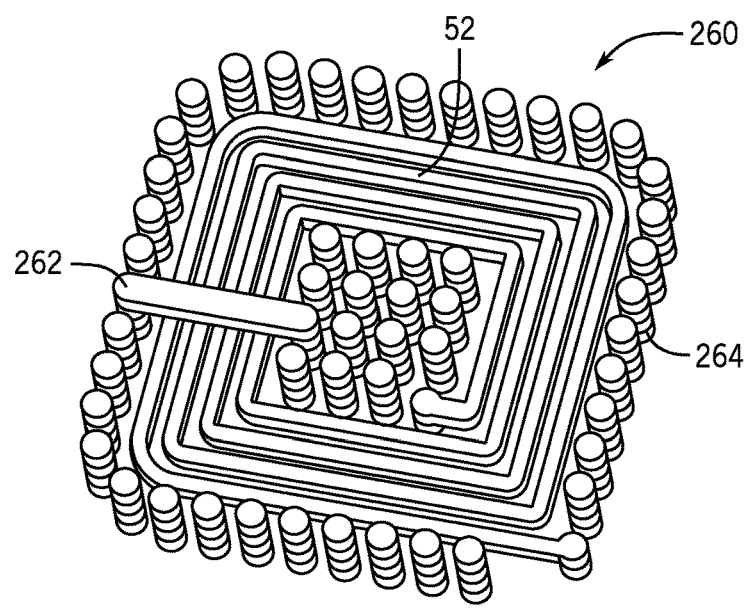
FIG. 16 is a diagram of a perspective view of a configuration of multiple magnetic field containment devices, in accordance with an embodiment of the present disclosure.

FIG. 16 is a diagram of a configuration 260 of a magnetic field containment device 262 used to at least partially contain the magnetic field emitted by the inductor 52, in accordance with an embodiment of the present disclosure. As illustrated, the inductor 52 may be of a in a shape of a flat coil, such as when part of a thin film application. As illustrated, the magnetic field containment device 262 includes a top portion coupled to an inner pillar and an outer pillar that surrounds the inductor 52. That is, the magnetic field device 262 may have a similar structure to that of the magnetic field device 54 of FIG. 7A. In some embodiments, at least some of the other pillars (e.g., 264) may also be coupled to a top portion to surround a larger area of the inductor 52. The magnetic field containment device 262 may be made of a material that has a desired relative permeability to at least partially contain a B-Field generated by the inductor 52 while enabling a desired saturation current in the inductor 52.

Figure 17:
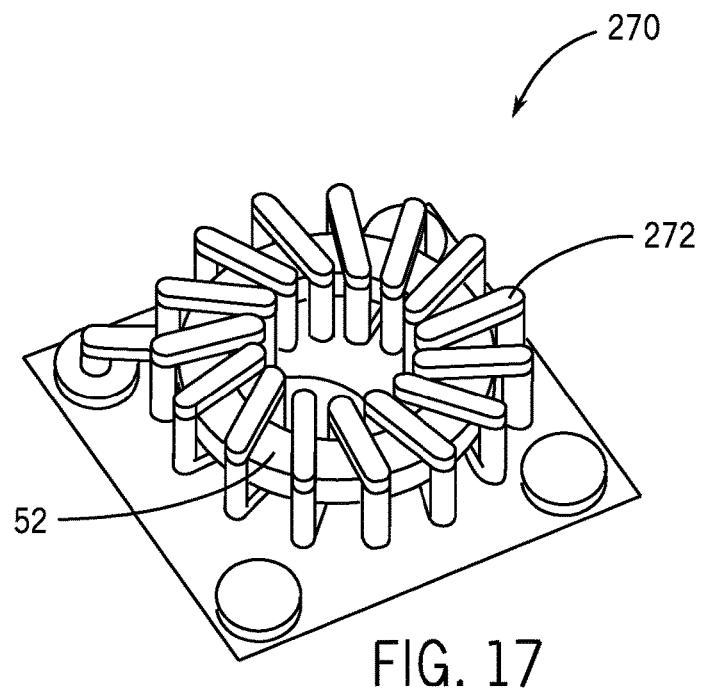
FIG. 17 is a diagram of a perspective view of a configuration of multiple magnetic field containment devices, in accordance with an embodiment of the present disclosure.

FIG. 17 is a diagram of a configuration 270 of multiple magnetic field containment devices 272 used to at least partially contain the magnetic field emitted by the inductor 52, in accordance with an embodiment of the present disclosure. As illustrated, each magnetic field containment device 272 includes a top portion coupled to a bottom portion by an inner pillar and an outer pillar that surrounds the inductor 52. That is, each magnetic field device 272 may have a similar structure to that of the magnetic field device 54 of FIGS. 11A-D. Each magnetic field containment device 262 may be made of a material that has a desired relative permeability to at least partially contain a B-Field generated by the inductor 52 while enabling a desired saturation current in the inductor 52.

Figure 18:
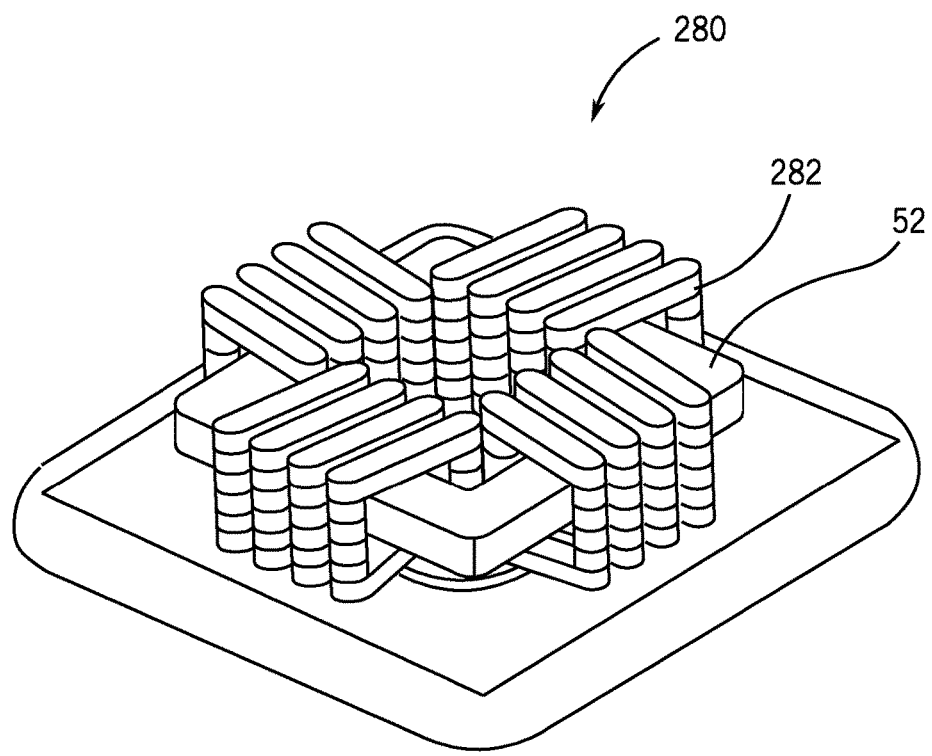
FIG. 18 is a diagram of a perspective view of a configuration of multiple magnetic field containment devices, in accordance with an embodiment of the present disclosure.

FIG. 18 is a diagram of a configuration 280 of multiple magnetic field containment devices 282 used to at least partially contain the magnetic field emitted by the inductor 52, in accordance with an embodiment of the present disclosure. As illustrated, each magnetic field containment device 282 includes a top portion coupled to a bottom portion by an inner pillar and an outer pillar that surrounds the inductor 52. That is, each magnetic field device 282 may have a similar structure to that of the magnetic field device 54 of FIGS. 11A-D. Each magnetic field containment device 282 may be made of a material that has a desired relative permeability to at least partially contain a B-Field generated by the inductor 52 while enabling a desired saturation current in the inductor 52.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A system comprising:
an inductor comprising an inner surface and an outer surface;
a plurality of magnetic field containment devices that at least partially surround the inductor, and, in operation, contain approximately 50 percent of a magnetic B-Field generated by electrical current in the inductor, wherein the plurality of magnetic field containment devices comprises:
a first magnetic field containment device comprising a first top portion coupled to a first bottom portion via a first inner pillar and a first outer pillar, wherein the first top portion, the first bottom portion, the first inner pillar, and the first outer pillar, enclose a first portion of the inductor along a first transverse plane of the inductor; and
a second magnetic field containment device not electrically connected to the first magnetic field containment device via any conductor, wherein the second magnetic field containment device comprises a second top portion coupled to a second bottom portion via a second inner pillar, an intermediate pillar, and a second outer pillar, wherein the second top portion, the second bottom portion, the second inner pillar, the intermediate pillar, and the second outer pillar, enclose a second portion of the inductor along a second transverse plane of the inductor.

2. The system of claim 1, wherein the plurality of magnetic field containment devices comprises:
a third magnetic field containment device of the plurality of magnetic field containment devices comprises a third top portion coupled to a third bottom portion via a third inner pillar, a third outer pillar, a fourth outer pillar, and a fifth outer pillar, wherein:
the third top portion, the third bottom portion, the third inner pillar, and the third outer pillar enclose a third portion of the inductor along a third transverse plane of the inductor;
the third top portion, the third bottom portion, the third inner pillar, and the fourth outer pillar enclose a fourth portion of the inductor along a fourth transverse plane of the inductor; and the third top portion, the third bottom portion, the third inner pillar, and the fifth outer pillar enclose a fifth portion of the inductor along a fifth transverse plane of the inductor.

3. The system of claim 1, wherein the inductor comprises a conductor, wherein each magnetic field containment device of the plurality of magnetic field containment devices comprises a relative permeability between 10 to 10000.

4. The system of claim 3, wherein each magnetic field containment device of the plurality of magnetic field containment devices comprises a relative permeability of approximately 80 to 200.

5. The system of claim 1, wherein the plurality of magnetic field containment devices, in operation, enables a saturation current in the inductor that is greater or equal to 75 percent of the saturation current in the inductor when not at least partially surrounded by the plurality of magnetic field containment devices.

6. A system comprising:
a circuit board;
an inductor mounted on the circuit board, wherein the inductor comprises a conductor, wherein the conductor is wound in a toroid shape;
a plurality of magnetic field containment devices at least partially surrounding the inductor, wherein at least two of the plurality of magnetic field containment devices are not electrically connected to one another via any conductor, wherein at least one magnetic field containment device of the plurality of magnetic field containment devices comprises:
a relative permeability of approximately between 10 and 10000; and
a top portion coupled to a bottom portion via an inner pillar, an intermediate pillar, and an outer pillar, wherein the top portion, the bottom portion, the intermediate pillar, and the outer pillar, enclose a portion of the inductor along a transverse plane of the inductor.

7. The system of claim 6, wherein the inductor comprises an approximately round shape.

8. The system of claim 6, wherein the inductor comprises an approximately rectangular shape.

9. The system of claim 6, wherein the inductor is continuous.

10. The system of claim 6, wherein the inductor is not continuous.

* * * * *